(12) United States Patent
Miwa et al.

(10) Patent No.: US 6,882,104 B2
(45) Date of Patent: Apr. 19, 2005

(54) ELECTROLUMINESCENT DEVICE WITH RESIN PROTECTIVE FILM

(75) Inventors: Hiroaki Miwa, Yokohama (JP); Katsuhiko Ishii, Mobara (JP); Setsuo Kobayashi, Mobara (JP); Yuji Mori, Urizura (JP)

(73) Assignees: Hitachi, Ltd., Tokyo (JP); Hitachi Device Engineering Co., Ltd., Chiba-ken (JP)

( * ) Notice: Subject to any disclaimer, the term of this patent is extended or adjusted under 35 U.S.C. 154(b) by 93 days.

(21) Appl. No.: 10/301,639

(22) Filed: Nov. 22, 2002

(65) Prior Publication Data

US 2003/0098648 A1 May 29, 2003

(30) Foreign Application Priority Data

Nov. 28, 2001 (JP) .................................. 2001-362031

(51) Int. Cl.[7] .............................................. H05B 33/00
(52) U.S. Cl. ........................ 313/506; 313/504; 313/512
(58) Field of Search ................................ 313/498, 504, 313/506, 509, 512; 428/917; 315/169.3

(56) References Cited

U.S. PATENT DOCUMENTS

| | | | | |
|---|---|---|---|---|
| 5,189,405 A | * | 2/1993 | Yamashita et al. | 313/512 |
| 5,488,266 A | * | 1/1996 | Aoki et al. | 313/509 |
| 5,589,732 A | * | 12/1996 | Okibayashi et al. | 313/506 |
| 5,909,081 A | * | 6/1999 | Eida et al. | 313/504 |
| 6,028,327 A | * | 2/2000 | Mizoguchi et al. | 257/98 |
| 6,097,147 A | * | 8/2000 | Baldo et al. | 313/506 |
| 6,285,125 B1 | * | 9/2001 | Mizuno | 313/512 |
| 6,635,988 B1 | * | 10/2003 | Izumizawa et al. | 313/504 |
| 6,660,409 B1 | * | 12/2003 | Komatsu et al. | 428/690 |

FOREIGN PATENT DOCUMENTS

| | | |
|---|---|---|
| JP | 6-203954 | 12/1992 |
| JP | 9-71771 | 9/1995 |
| JP | 10-41067 | 7/1996 |
| JP | 10308635 | * 5/2000 |
| JP | 2002-134270 | 10/2000 |

* cited by examiner

*Primary Examiner*—Ashok Patel
(74) *Attorney, Agent, or Firm*—Reed Smith LLP; Stanley P. Fisher, Esq.; Juan Carlos A. Marquez, Esq.

(57) ABSTRACT

Electroluminescence elements mounted on a substrate of an OLED display device are sealed by a protective film made of synthetic resin with chemical reaction curing in place of a sealing can. The protective film is formed such that a thickness thereof is equal to or larger than a thickness of the substrate. Alternatively, the protective film is formed by laminating a plurality of resin films which differ in one of the water absorption ratio, the elastic modulus and the hardness. With respect to the protective film which is formed of a plurality of laminated films, compared to the protective film at the electroluminescence element side, the protective film which covers the former protective film has the water absorption ratio, the elastic modulus or the hardness larger than the water absorption ratio, the elastic modulus or the hardness of the former protective film. Due to such a constitution, it is possible to reduce the thickness of the OLED display device without damaging the moisture-proof property of the electroluminescence elements.

11 Claims, 4 Drawing Sheets

ELECTROLUMINESCENT DEVICE WITH RESIN PROTECTIVE FILM

BACKGROUND OF THE INVENTION

1. Field of the Invention

The present invention relates to a display device, and more particularly to a technique which is effectively applicable to an electroluminescence display device adopting organic electroluminescence elements.

2. Description of the Related Art

Recently, an electroluminescence display device adopting organic electroluminescence elements has been attracting an attention as a next-generation flat display device which is capable of replacing a CRT (cathode ray tube) and a liquid crystal display device. The organic electroluminescence display device is described as an organic EL device in an abbreviated form and is also referred to as an organic light-emitting diode display device and hence, the display device is hereinafter specified as an OLED display device which is an abbreviation of the latter device, that is, an organic light-emitting diode display device in this specification.

To compare with the current flat display device such as the liquid crystal display device or the like, the OLED display device has several features including (1) a feature that a voltage necessary for emitting light is low, that is, equal to or less than 10V and hence, the power consumption can be made small, (2) a feature that the OLED display device is of a self light emitting type and hence, a backlight is unnecessary, (3) a feature that a vacuum structure which is necessary in a plasma display device which is also of a self light emitting type is unnecessary in the OLED display device and hence, the OLED display device can be made light-weighted and thin and (4) a feature that a response time is short, that is, several $\mu$ seconds and hence, the OLED display device exhibits a wide viewing angle of equal to or more than 170 degrees.

Such a technique is described in, for example, a following patent-unrelated literature (1).

Patent-unrelated Literature (1):
"Acquire a basic patent on a circuit aiming at the higher definition of an organic EL panel" (Nikkei Electronics, 2000.4.24 (no. 768), pp. 163 to 170, Apr. 24, 2000).

Further, structures on which the above-mentioned organic electroluminescence elements in the OLED display device are mounted are described in, for example, following patent literatures.

Patent Literature (1):
Japanese Laid-open Patent No. 203954/1994 (JP-A-6-203954).

Patent Literature (2):
Japanese Laid-open Patent No. 071771/1997 (JP-A-9-071771).

Patent Literature (3):
Japanese Laid-open Patent No. 041067/1998 (JP-A-10-041067).

Patent Literature (4):
Japanese Laid-open Patent No. 134270/1998 (JP-A-2002-134270).

Although the above-mentioned OLED display device is roughly classified into a single matrix type OLED display device and an active matrix type OLED display device due to shapes of an anode and a cathode, these OLED display devices have the same basic structure with respect to an OLED display element.

Figure 9:
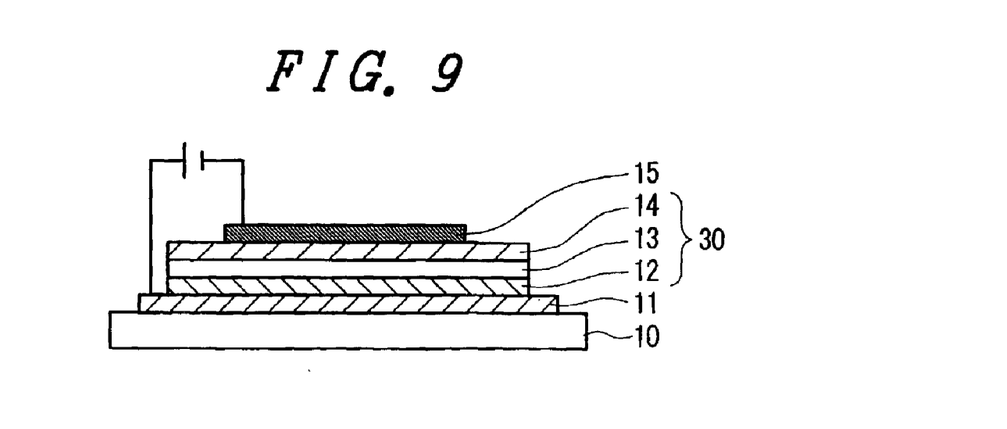
FIG. 9 is a cross-sectional view showing the basic structure of an OLED display element.

FIG. 9 is a cross-sectional view showing the basic structure of the OLED display element.

As shown in FIG. 9, the OLED display element is constituted by laminating an anode 11 formed of a transparent electrode which is made of ITO (Indium Tin Oxide) or the like, a hole-transporting layer 12, a light emitting layer 13, an electron-transporting layer 14 and a cathode 15 onto a glass substrate 10 in the order described above.

When a voltage is applied between the anode 11 and the cathode 15, positive holes implanted from the anode 11 and electrons implanted from the cathode 15 are coupled again in the inside of the light emitting layer 13, organic molecules which form the light emitting layer 13 are excited to produce excitons, then light is emitted from the light emitting layer 13 in a process that the excitons are subjected to the radiation deactivation, and the light is emitted to the outside from the transparent anode 11 through the glass substrate 10 thus performing the light emission.

Hereinafter, a multi-layered film constituted of the hole transporting layer 12, the light emitting layer 13 and the electron transporting layer 14 is referred to as an OLED film 30.

In the single matrix type OLED display device, the anode 11 and the cathode 15 shown in FIG. 9 are respectively constituted of a large number of stripe electrodes which cross each other at a right angle while sandwiching the OLED film 30 therebetween. A driving voltage is applied to pixels which are arranged at crossing points of a large number of stripe electrodes which constitute the anode 11 and a large number of stripe electrodes which constitute the cathode 15. To compare the single matrix type OLED display device and a single matrix type liquid crystal display device (for example, a passive matrix type liquid crystal display device known as a STN type liquid crystal display device), while a group consisting of a plurality of common electrodes (a group of first stripe electrodes) and a group consisting of a plurality of segment electrodes (a group of second stripe electrodes) are respectively mounted on a pair of substrates which are arranged at both sides of a liquid crystal layer in the latter, the group of first stripe electrodes and the group of second stripe electrodes are respectively mounted on both sides of the above-mentioned OLED film which is formed on a main surface of one substrate in the former.

Further, in the active matrix type OLED display device, the anode 11 is formed for every pixel and a driving voltage is applied to the anode 11 by way of an active element, for example, a TFT (Thin Film Transistor) which is provided for every pixel. To compare the active matrix type OLED display device and an active matrix type liquid crystal display device, the above-mentioned anode 11 of the former corresponds to a pixel electrode of the latter and the cathode 15 of the former corresponds to a counter electrode (common electrode) of the latter.

Irrespective of the difference between the passive matrix driving method and the active matrix driving method, there may be a case that the OLED film 30 of the above-mentioned OLED display device includes at least the light emitting layer (organic material layer which exhibits an electroluminescence phenomenon) 13 and does not include the above-mentioned hole transporting layer 12 and the above-mentioned electron transporting layer 14.

Figure 10:
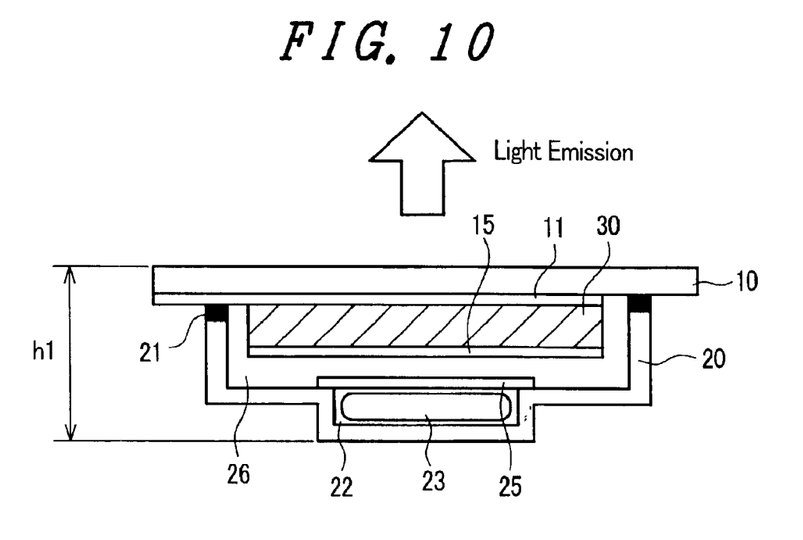
FIG. 10 is a schematic cross-sectional view showing the structure of a conventional OLED display device.

FIG. 10 is a schematic cross-sectional view showing the structure of a conventional OLED display device.

The OLED display device shown in FIG. 10 is constituted of a glass substrate 10 which forms a display surface and a sealing can 20 which is adhered and sealed to the glass substrate 10 using an adhesive agent 21. Here, the adhesive agent 21 is made of ultraviolet curing type resin.

An anode 11, an OLED film 30 and a cathode 15 are formed on the glass substrate 10, wherein the OLED film 30 is formed of a multi-layered film which is constituted of a hole transporting layer 12, a light emitting layer 13 and an electron transporting layer 14. In other words, the OLED display device shown in FIG. 10 is provided with the laminated structure ranging from the anode 10 to the cathode 15 shown in FIG. 9 for every pixel.

Light emitted from the light emitting layer 13 of the OLED film 30 is irradiated to the glass substrate 10 side as indicated by an arrow in FIG. 10.

Further, the sealing can 20 is made of metal such as stainless steel. As shown in FIG. 10, a recessed portion 22 is formed in a portion of the sealing can 20 and a drying agent 23 is fixedly housed in the recessed portion 22 using a tape 25. The recessed portion 22 is provided at an approximately center portion of the sealing can 20.

Further, in a sealing space 26 which is surrounded by the sealing can 20 and the glass substrate 10, a dried and inert gas (nitrogen gas, for example) is sealed.

In the single matrix type OLED display device shown in FIG. 10, one of a plurality of stripe electrodes which constitute the anode 11 is shown as a thin film which extends in the lateral direction in FIG. 10 and cross sections of a plurality of stripe electrodes which constitute the cathode 15 are indicated such that they are arranged in parallel in the lateral direction. In other words, the plurality of the above-mentioned anodes 11 are arranged in parallel and the plurality of the above-mentioned cathodes 15 extend along the normal direction of FIG. 10. In this manner, the plurality of anodes 11 and the plurality of cathodes 15 are formed on the main surface of the glass substrate 10 such that they cross each other at a right angle while sandwiching the OLED film 30 therebetween.

SUMMARY OF THE INVENTION

In the above-mentioned OLED display device, the cathode 15 is made of Mg/Ag, LiF/Al or Ca/Al or the like.

The OLED film 30 and the cathode 15 exhibit low resistance against water, oxygen, heat or ultraviolet rays. Particularly, water largely affects the OLED film 30 such that the light emission through the OLED film 30 is interrupted thus forming the OLED film 30 into a non-light emitting film. That is, water becomes the largest factor for causing a defect which is a so-called dark spot.

Accordingly, to realize the highly reliable OLED display device, it is necessary to prevent the intrusion of these elements into the above-mentioned OLED film 30 and the cathode 15. Accordingly, in the conventional OLED display device, at the time of manufacturing the OLED display device, the dried inert gas is sealed in the inside of the sealing space 26 sealed by the sealing can 20. As the inert gas, a nitrogen gas having a frost point (a dew point) of equal to or less than −80 degree centigrade is used, for example.

Although it is necessary to maintain this state even the OLED display device is formed into a panel, there may be a case that water molecules contained in the ambient air intrude into the inside of the sealing space by way of the adhesive agent 21.

Accordingly, to absorb the water molecules which intrude the inside of the sealing space from the outside after the OLED display device is formed into the panel, the drying agent 23 which always holds the proper drying state at the time of sealing is sealed in the inside of the sealing space 26.

Here, as shown in FIG. 10, the drying agent 23 is mounted in the recessed portion 22 of the sealing can 20.

Accordingly, with respect to the conventional OLED display device, there has been a drawback that the thickness (h1 shown in FIG. 10) of the display device is large.

For example, the thickness of the conventional OLED display device is approximately 7 mm and hence, to take into account the fact that the thickness of the conventional liquid crystal display module (the thickness including that of a backlight) is approximately 9 mm, the thickness of the conventional OLED display device is not drastically decreased.

In this manner, the conventional OLED display device has not made the full use of the feature of OLED display elements that the OLED display elements can reduce the thickness of the display device.

Further, the conventional OLED display device adopts the structure in which the sealing can 20 which is made of metal (stainless steel, for example) is sealed to the glass substrate 10 by the adhesive portion 21.

Accordingly, there has been a drawback that an area of the adhesive portion 21 between the sealing can 20 and the glass substrate 10 is small and hence, water intrudes into the inside of the sealing space sealed by the glass substrate 10 and the sealing can 20 from the outside by way of the adhesive portion 21 and the display degradation is liable to occur or the sealing can 20 is liable to be easily peeled off from the glass substrate 10 due to an external stress.

Further, in the conventional OLED display device, there has been also a drawback that the difference is easily generated between the pressure inside the sealing space sealed by the glass substrate 10 and the sealing can 20 and the external pressure and hence, a leaking path is easily formed.

Further, in the conventional OLED display device, there has been a drawback that it is necessary to form the sealing can 20 having a recessed shape and hence, the manufacturing cost is pushed up.

Further, since the metal such as stainless steel is used as the material of the sealing can 20, there has been a drawback that the sealing can 20 cannot be made sufficiently light-weighted.

The present invention has been made to overcome these drawbacks of the prior art and it is an object of the present invention to provide a technique which can make a display device using electroluminescence elements thinner than a conventional display device using electroluminescence elements.

It is another object of the present invention to provide a technique which can make a display device using electroluminescence elements more light-weighted than a conventional display device using electroluminescence elements.

It is still another object of the present invention to provide a technique which can enhance the moisture-proof property of a display device using electroluminescence elements than a conventional display device using electroluminescence elements.

It is a further object of the present invention to provide a technique which can reduce a manufacturing cost of a display device using electroluminescence elements than a conventional technique for manufacturing a conventional display device using electroluminescence elements.

The above-mentioned and other objects and novel features of the present invention will become apparent by the description of this specification and attached drawings.

To briefly explain the summary of typical inventions among inventions disclosed in the present application, they are as follows.

The present invention is characterized in that in a display device which forms electroluminescence elements on a substrate, the display device includes a protective film which is formed over the electroluminescence elements such that the protective film is brought into close contact with the electroluminescence elements and covers the electroluminescence elements.

The protective film is, for example, formed of a synthetic resin film with chemical reaction curing (a synthetic resin film formed of, for example, epoxy-series resin urethane-series resin, acrylic-series resin, vinyl-series resin or silicone-series resin).

In this manner, according to the present invention, in place of adhering a sealing can to a substrate using an adhesive agent and covering electroluminescence elements mounted on the substrate with the sealing can which have been performed conventionally, the protective film which covers the electroluminescence elements is formed in an arbitrary shape and with an arbitrary thickness and hence, it is possible to make the display device thinner and more light-weighted compared to the conventional display device.

Further, according to the present invention, the protective film is formed such that the protective film is brought into close contact with the whole surface of the electroluminescence elements and hence, it is possible to enhance the moisture-proof property of the display device than the conventional display device.

Further, according to the present-invention, it is possible to use the synthetic resin film with chemical reaction curing having hardness of 20 to 80 at Shore hardness A as the protective film and hence, it is possible to enhance the strength of the display device compared to that of a conventional display device.

Further, according to the present invention, the protective film is constituted of n pieces of protective films which are sequentially laminated to the electroluminescence elements, wherein assuming the protective film which covers the electroluminescence elements as a first protective film, and protective films which are formed by sequentially laminating on the first protective film as the second film to the n-th protective film, respective protective films satisfy a following formula (1) or a following formula (2).

water absorption ratio of the first protective film<water absorption ratio of the second protective film< . . . <water absorption ratio of the n-th protective film    (1)

elastic modulus or hardness of the first protective film<elastic modulus or hardness of the second protective film< . . . <elastic modulus or hardness of the n-th protective film    (2)

Further, the present invention includes a glass or metal film or a photoelectric converting element (solar cell, for example) which covers the protective film.

DETAILED DESCRIPTION

Preferred embodiments of a display device according to the present invention are explained hereinafter in conjunction with drawings.

Here, in all drawings for explaining the embodiments, parts which have identical functions are indicated by same symbols and the repeated explanations of these parts are omitted.

[Embodiment 1]

Figure 1:
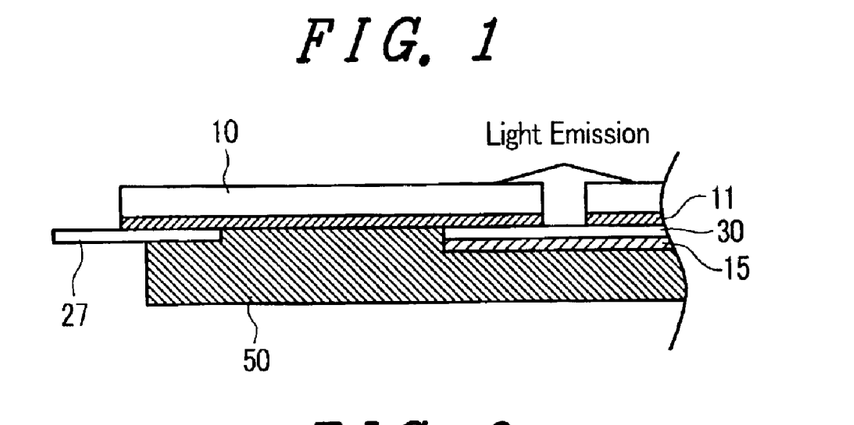
FIG. 1 is a cross-sectional view of an essential part showing the schematic constitution of an OLED display device according to an embodiment 1 of the present invention.

FIG. 1 is a cross-sectional view of an essential part showing the schematic constitution of an OLED display device according to an embodiment 1 of the present invention. FIG. 1 shows a portion of the OLED display device of this embodiment which corresponds to the vicinity of a left end of the conventional display device shown in FIG. 10 in an enlarged form. As can be clearly understood from the comparison between the constitution shown in FIG. 1 and the constitution 10 shown in FIG. 10, the display device according to this embodiment is provided with a protective film 50 which will be explained later in place of the sealing can 20 which has been mounted on the conventional display device. In FIG. 1, one of a plurality of anodes (a group of first stripe electrodes) 11 is shown in cross section which extends along the extension direction of the anodes. In FIG. 1, although a plurality of cathodes (a group of second stripe electrodes) 15 are shown as a one-layered thin film, the fact is that, as shown in FIG. 10, the cathode 15 is constituted of a plurality of thin films which are arranged in the extension direction of the above-mentioned one anode.

As shown in FIG. 1, also in this embodiment, on the glass substrate 10 which forms a display surface, the anodes 11, OLED films 30 and the cathodes 15 are formed. Further, as mentioned previously, although the OLED film 30 is formed of a multi-layered film consisting of a hole transporting layer 12, a light emitting layer 13 and an electron transporting layer 14, at least one of the hole transporting layer 12 and the electron transporting layer 14 may be omitted depending on the situation.

Light emitted from the light emitting layer 13 of the OLED film 30 is irradiated to the glass substrate 10 side as indicated by an arrow in FIG. 1.

The OLED display device according to this embodiment is also a single matrix type OLED display device and is formed such that a large number of stripe electrodes which constitute the anodes 11 and a large number of stripe electrodes which constitute the cathodes 15 cross each other at a right angle while sandwiching the OLED films 30 therebetween.

However, in FIG. 1, the illustration of a large number of stripe electrodes which constitute the anodes 11 and a large number of stripe electrodes which constitute the cathodes 15 is omitted from the drawing.

This embodiment is characterized by providing a protective film 50 in place of the conventional sealing can 20, wherein the protective film 50 is formed such that the protective film 50 is brought into close contact with the anodes 11, the OLED films 30 and the cathodes 15 and covers the anodes 11, the OLED films 30 and the cathodes 15. In other words, electroluminescence elements (a plurality of electroluminescence elements which are arranged two-dimensionally on the main surface of the substrate 10) each of which is formed by sequentially laminating the anode 11, the OLED film 30 and the cathode 15 to regions corresponding to respective pixels on the substrate 10 have sides thereof disposed opposite to the substrate 10 covered with the protective film 50.

The protective film 50 is constituted of a synthetic resin film with chemical reaction curing. The synthetic resin film with chemical reaction curing is formed of at least one selected from a group consisting of, for example, resin material of epoxy-series, resin material of urethane-series, resin material of acrylic series, resin material of vinyl series and resin material of silicone series.

That is, the protective film 50 of this embodiment uses a reactive-type compound which is formed of monomers or oligomers (polymer of 2 to 4 monomers) of epoxy series, urethane series, acrylic series, vinyl series or silicone series as a raw material and is formed by curing the material under a room temperature, or by a heat treatment applied to the material or by the irradiation of light to the material.

Here, to the protective film 50, an inorganic filler such as silica ($SiO_2$), alumina ($Al_2O_3$), a moisture absorbing agent such as alkaline-earth oxide, an absorbent such as carbide, molecular sieve is added when necessary.

In the OLED display device shown in FIG. 1, the above-mentioned protective film raw material (organic material or resin material) which is cured by chemical reaction is supplied in a liquid form to the electroluminescence elements formed on the main surface of the glass substrate 10 and then the raw material is selectively cured in the inside of the main surface of the glass substrate 10 by casting thus forming the protective film 50. Accordingly, in the OLED display device shown in FIG. 1, due to the selective curing of the raw material liquid, it is possible to form the protective film 50 having an arbitrary shape and an arbitrary thickness within the main surface of the glass substrate 10.

In this embodiment, to impart a role of the sealing can 20 in the conventional OLED display device to the above-mentioned protective film 50, it is preferable to take the strength and the moisture-proof property of the protective film 50 into consideration such that the protective film 50 can sufficiently perform such a role. The greater the thickness of the protective film 50, it is possible to suppress more effectively the intrusion of moisture into the electroluminescence element from the atmosphere of the display device. Further, from a viewpoint of protecting the electroluminescence elements from a mechanical impact applied to the display device, it is preferable that the protective film 50 has the large thickness. However, to take the difference of thermal coefficient between the raw material of the base substrate 10 and the protective film 50 into consideration, in response to the fluctuation of the atmosphere temperature of the display device, a strain which is generated between the substrate 10 and the protective film 50 is increased correspondingly to the increase of the thickness of the protective film 50 and the peeling-off of the protective film 50 from the substrate 10 and the disconnection of a wiring layer which is formed on the substrate 10 are more liable to occur.

When the above-mentioned OLED display device is prepared by using a glass substrate (having a thickness in a range of 0.6 to 1.0 mm, for example) adopted by a liquid crystal display device, as a result of study of the distribution of thickness between the substrate 10 and the protective film 50, it is concluded that it is preferable to set the practically desirable thickness of the protective film 50 on the above-mentioned electroluminescence element to a value equal to or more than the thickness of the substrate 10. It is further preferable to set the thickness of the protective film 50 to a value equal to or less than three times larger than the thickness of the substrate 10. Still further, the thickness of the protective film 50 may preferably be set to a value equal to or less than twice larger than the thickness of the substrate 10, for example, by taking the moisture-proof property and the strength of the protective film 50 into account. Accordingly, in an example of the OLED display device according to this embodiment, it is possible to seal the electroluminescence elements using the protective film 50 having the thickness substantially equal to the thickness of the substrate 10.

By forming the protective film 50 using aliphatic resin or alicyclic resin which does not contain the conjugation structure and the hyperconjugation structure as principal chains such as the above-mentioned epoxy series, urethane series, acrylic series, vinyl series or silicone series, it is possible to obtain the protective film 50 having the mechanical strength compatible to the mechanical strength of the conventional sealing can. With the use of the protective film 50 formed of such a resin material, it is no more necessary to provide a layer of perylene compound containing the hyperconjugation structure between a sealing layer (corresponding to the protective layer of this embodiment) and the organic thin-film laminated body (corresponding to the electroluminescence element of this embodiment) which are disclosed in the above-mentioned patent literature (2).

In FIG. 1, the protective film 50 is formed over the entire surface of the glass substrate 10 such that the protective film 50 covers not only the anodes 11, the OLED films 30 and the cathodes 15 which is formed over the substrate 10 but also a flexible printed wiring board 27 which is arranged over an end portion of the substrate 10 and is connected to the anodes 11.

In this manner, according to this embodiment, in place of covering the anodes 11, the OLED films 30 and the cathodes 15 with the sealing can 20 which has been performed conventionally, the protective film 50 which covers the anodes 11, the OLED films 30 and the cathodes 15 is formed and hence, it is no more necessary to provide the sealing can 20 and the drying agent 23 whereby it is possible to make the OLED display device thinner and more light-weighted than the conventional OLED display device.

Further, in this embodiment, the protective film 50 is formed such that the protective film 50 is brought into close contact with the entire surface of the anodes 11, the OLED films 30 and the cathodes 15, it is possible to enhance the moisture-proof property of the OLED display device compared to the conventional OLED display device.

To describe this embodiment from a different viewpoint, since the anodes 11, the OLED films 30 and the cathodes 15 are covered with the protective film 50, even when a stress is applied to the protective film 50 from the outside, there is no possibility that the protective film 50 is peeled off. Further, by forming the protective film 50 using the synthetic resin film with chemical reaction curing which has the hardness falling in a range of 20 to 80 at Shore hardness A, it is possible to enhance the strength of the OLED display device compared to the conventional OLED display device.

When the hardness of the protective film 50 is excessively high, due to a warp caused by the thermal expansion of the substrate 10 or the like, electrode layers or wiring layers formed on the substrate 10 are peeled off. Accordingly, the protective film 50 is required to have the proper hardness which is neither excessively soft nor excessively hard. In this embodiment, the proper range of hardness is determined by the measured values of a durometer used in a rubber hardness testing method based on JIS K 6253 (Japanese Industrial Standard). The measured values are referred to as type A of the durometer hardness or Shore hardness A.

Figure 11A:
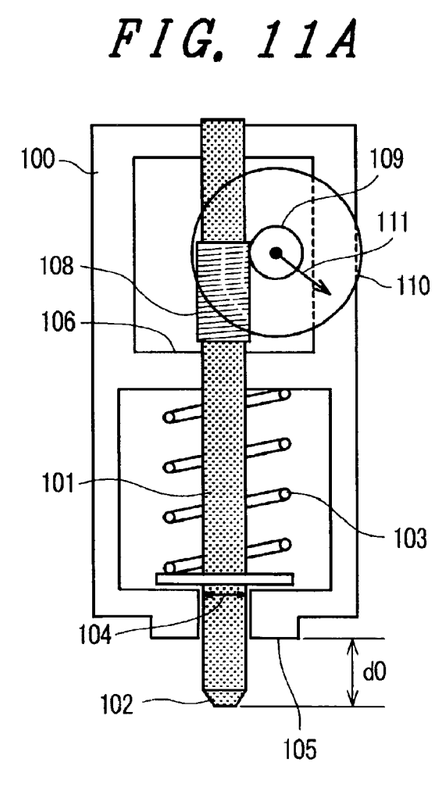
FIG. 11A is a cross-sectional view of a durometer for measuring the hardness of a protective film of the OLED display device according to the present invention and FIG. 11B is a view for explaining the measurement of hardness of samples using this durometer.

FIG. 11A is a cross-sectional view which schematically shows the structure of the durometer. In a casing 100 of the durometer, a spindle 101 is mounted such that the spindle 101 is movable in the axial direction thereof. One end of the spindle 101 is projected to the outside of the casing 100 through a clearance hole 104 as a pressure needle 102 which is brought into contact with a surface of a measuring sample. An outer surface (a lowermost surface in FIG. 11A) of the casing 100 in which the clearance hole 104 is formed is referred to as a pressing surface 105. In the inside of the casing 100, a spring 103 is arranged around the spindle 101, wherein one end of the spring 103 is brought into contact with a flange 106 housed in the inside of the casing 100 and the other end of the spring 103 is brought into contact with a brim portion 107 of the spindle 101. Due to such a constitution, when the surface of the measuring sample is pushed with the above-mentioned pressing needle 102, the pressing needle 102 is shifted along the axial direction of the spindle 101 to a position where the hardness of the sample and a repulsive force of the spring 103 balance with each other. Accordingly, the spindle 101 is also referred to as a plunger. The displacement of the pressure needle 102 which corresponds to the hardness of the measuring sample rotates a gear 109 as the displacement of a rack 108 which is mounted on the spindle 101 and the rotation of the gear 109 imparts the stator displacement to a pointer 111 of a dial gauge 110.

Figure 11B:
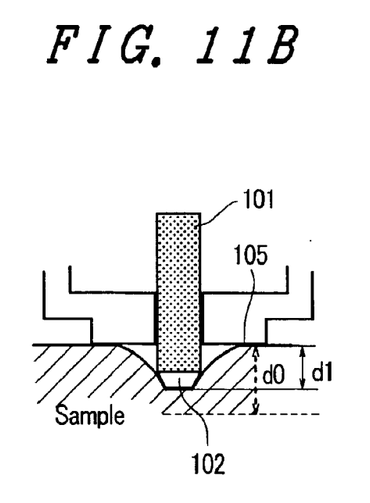

The hardness of the sample which is evaluated as the Shore hardness A is defined, as shown in FIG. 11B, as a value: "(d1/d0)×100" which is obtained by dividing a distance d1 between a distal end of the pressure needle 102 and the pressing surface 105 when the pressure needle 102 is brought into pressure contact with the surface of the sample with a distance d0 between the distal end of the pressure needle 102 and the pressing surface 105 when a force is not applied to the pressure needle 102 and then by multiplying the divided value with 100. Accordingly, the Shore hardness A is expressed by any value in a range of 0 to 100 and it is evaluated that the smaller the value, the hardness of the measuring sample is increased. In this embodiment, the inspection of hardness is carried out by bringing the pressure needle 102 of the durometer into pressure contact with an upper surface (a lower surface in FIG. 1) of the protective film 50 formed on an image display region where electroluminescence elements are arranged and by inspecting whether the hardness is within a proper range or not. As the durometer which is suitable for measuring the hardness of the resin sample according to the Shore hardness A, for example, a rubber durometer having a type name: ESA, (a product of Elastron, Inc., http://elastron.co.jp) is named.

In this manner, according to this embodiment, by optimizing the hardness of the protective film 50, the recessed sealing can 20 which covers the electroluminescence element conventionally is no more necessary and hence, the number of parts of the OLED display device can be reduced so that the manufacturing cost can be reduced.

FIG. 2 to FIG. 5 are cross-sectional views of essential parts showing the schematic constitutions of modifications of the OLED display device according to this embodiment.

Figure 2:
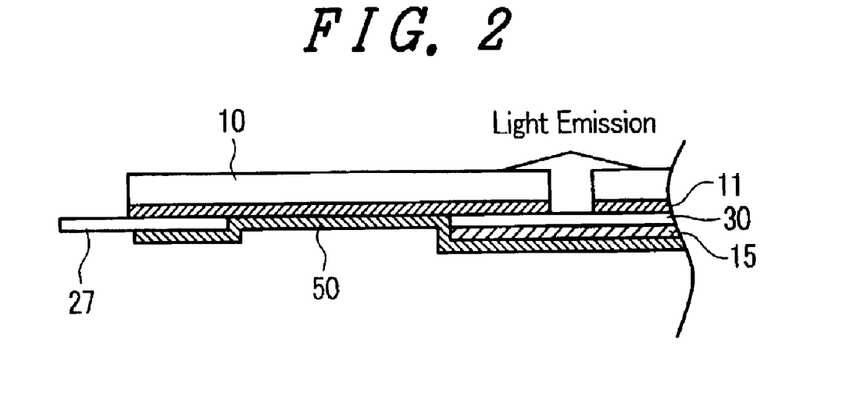
FIG. 2 is a cross-sectional view of an essential part showing the schematic constitution of a modification of the OLED display device according to the embodiment 1 of the present invention.

The OLED display device shown in FIG. 2 is a display device which uses a low-viscosity reaction type compound in a liquid form as the chemical reactive-type compound and the protective film 50 is formed by applying the reactive-type compound as a thin film. To compare the OLED display device shown in FIG. 2 with the above-mentioned OLED display device which has been explained in conjunction with FIG. 1, the thickness of the protective film 50 is made considerably thin in the OLED display device shown in FIG. 2. However, so long as the hardness falls within the above-mentioned optimum value range of the Shore hardness A, there arises no practical drawbacks. According to the OLED display device shown in FIG. 2, it is possible to provide the OELD display device which is thin and light-weighted and can be manufactured at a low cost.

Figure 3:
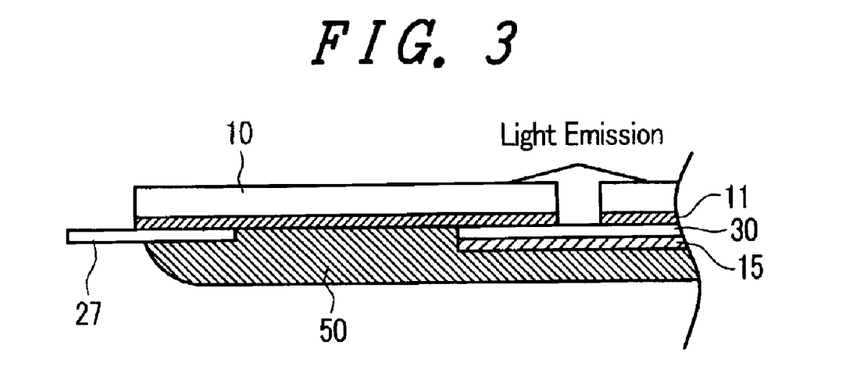
FIG. 3 is a cross-sectional view of an essential part showing the schematic constitution of a modification of the OLED display device according to the embodiment 1 of the present invention.

The OLED display device shown in FIG. 3 is characterized in that a main surface of the substrate 10 on which electroluminescence elements are formed is covered with a chemical reactive-type compound in a liquid form having low hardness and high viscosity by potting coating thus forming the protective film 50 having a curvature at a peripheral corner thereof. In the OLED display device shown in FIG. 3, the peripheral corner is rounded and hence, it is possible to prevent the rupture of the protective film 50 which may be caused by an external stress.

In the same manner as the OLED display device shown in FIG. 1, the protective film 50 is formed with a large thickness in the OLED display device shown in FIG. 3. Accordingly, the irregular shape of the main surface of the substrate 10 which is generated by forming the electroluminescence elements (the above-mentioned laminated structures including anodes 11, the OLED films 30, the cathodes 15 and the like) and the flexible printed wiring board 27 on the substrate 10 can be leveled on an upper surface (a lower surface in FIG. 1 and FIG. 3) of the protective film 50 due to the formation of the protective film 50. In other words, the surface of the protective film 50 is leveled over the substantially whole area of the main surface of the substrate 10 in the OLED display device shown in FIG. 1 and over the region of the main surface of the substrate 10 except for the periphery of the main surface in the OLED display device shown in FIG. 3. When the surface of the protective film 50 has no irregularities, an area of the surface of the protective film 50 is smaller than an area of a main surface of the substrate 10 (including the upper surfaces of the electroluminescence elements and the flexible printed wiring board 27) which is covered with the protective film 50 and hence, a contact area between the atmosphere around the OLED display device and the protective film 50 is suppressed whereby an amount of moisture in the atmosphere which intrudes into the protective film 50 is also reduced. Further, even when the OLED display device is used in an environment with high humidity, since the indentation of the protective film 50 becomes shallow or is eliminated, the probability that water is formed on the surface of the protective film 50 by condensation is reduced. Further, the area of the protective film 50 which corresponds to a display screen of the OLED display device is leveled and hence, the distortion of display images or the interference of light between the pixels can be suppressed when light is irradiated from the protective film 50 as in the case of embodiments which will be explained later.

Figure 4:
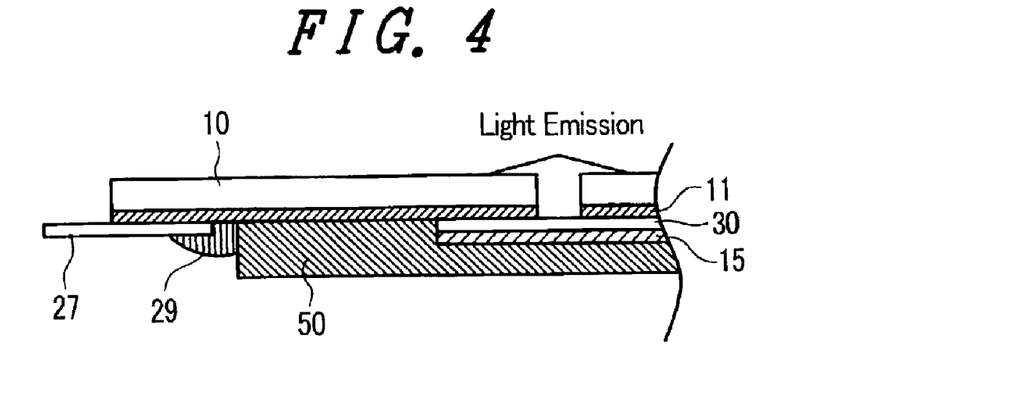
FIG. 4 is a cross-sectional view of an essential part showing the schematic constitution of a modification of the OLED display device according to the embodiment 1 of the present invention.

The OLED display device shown in FIG. 4 is characterized in that the protective film 50 is formed over the main surface of the substrate 10 except for a terminal portion of the flexible printed wiring board 27 and an FPC adhesive agent 29 is formed on the terminal portion of the flexible printed wiring board 27.

Figure 5:
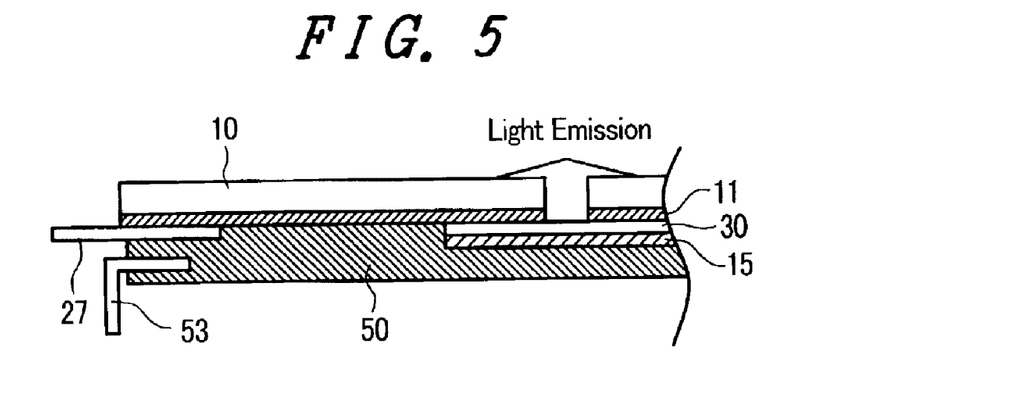
FIG. 5 is a cross-sectional view of an essential part showing the schematic constitution of a modification of the OLED display device according to the embodiment 1 of the present invention.

The OLED display device shown in FIG. 5 is characterized in that a fixing member (mounting fitting, for example) 53 for assembling the OLED display device to a device such as a personal digital assistants (PDA) is integrally formed with the protective film 50. In the OLED display device shown in FIG. 5, since the fixing member 53 is integrally formed with the OLED display device in advance, the number of parts of peripheral members can be decreased and hence, the manufacturing cost can be further reduced.

[Embodiment 2]

Figure 6:
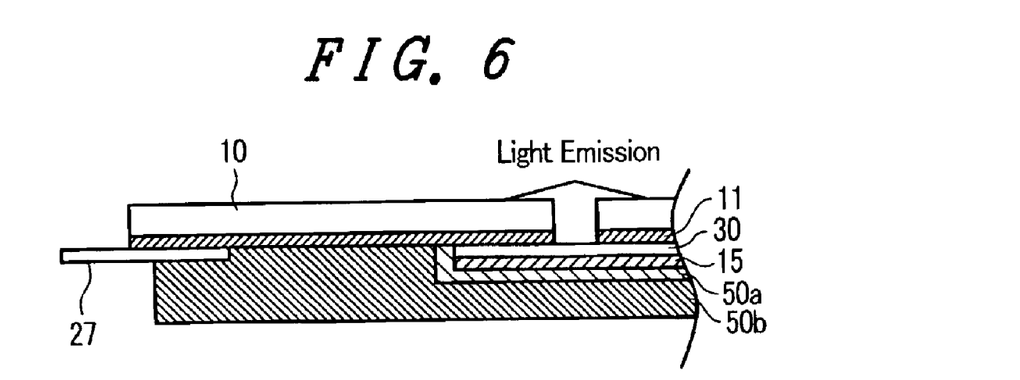
FIG. 6 is a cross-sectional view of an essential part showing the schematic constitution of an OLED display device according to an embodiment 2 of the present invention.

FIG. 6 is a cross-sectional view of an essential part showing the schematic constitution of the OLED display device of the embodiment 2 of the present invention.

The OLED display device of this embodiment differs from the OLED display device of the above-mentioned embodiment 1 in that the protective film 50 is formed of a multi-layered film which is constituted of a first protective film 50a which covers anodes 11, OLED films 30 and cathodes 15 and a second protective film 50b which covers the first protective film 50a.

Here, at least the second protective film 50b (formed in a more spaced-apart manner from the electroluminescence elements than the first protective film 50a) out of the first protective film 50a and the second protective film 50b is constituted of a synthetic resin film with chemical reaction curing, for example. The protective film 50 may be formed such that the first protective film 50a is formed of a sheet-like resin film, for example, and covers a main surface of the substrate 10 on which electroluminescence elements are formed, and resin material of chemical reaction curing is applied to the first protective film 50a and is cured so as to form the second protective film 50b. In this case, it is preferable to set the thickness of the second protective film 50b formed on the electroluminescence elements to a value equal to or more than the thickness of the substrate 10 in the same manner as the protective film 50 of the previously-mentioned embodiment 1. Further, the first protective film 50a may be formed of a synthetic resin film with chemical reaction curing in the same manner as the second protective film 50b. In this case, it is preferable to set the thickness of a laminated body made of the first protective film 50a and the second protective film 50b over the electroluminescence elements to a value equal to or more than the thickness of the substrate 10 in the same manner as the protective film 50 explained in the embodiment 1.

That is, in the same manner as the protective film 50 of the previously-mentioned embodiment 1, using a chemical reactive-type compound which is formed of monomers or oligomers of epoxy series, urethane series, acrylic series, vinyl series or silicone series as a raw material, the protective films 50a, 50b are formed by curing them under the room temperature, the heat treatment or the irradiation of light to the material.

Here, when necessary, to this protective film (50a, 50b), an inorganic filler (silica, alumina or the like, for example), a moisture absorbing agent (alkaline-earth oxide or the like) or an absorbent (carbide, molecular sieve or the like) are added.

In this embodiment, the water absorption ratio of the second protective film 50b is set larger than the water absorption ratio of the first protective film 50a (the water absorption ratio of the first protective film 50a<the water absorption ratio of the second protective film 50b).

In one example of the evaluation of the water absorption ratio in this embodiment is confirmed such that the two-layered film which is formed by laminating the first protective film 50a and the second protective film 50b is peeled off from the main surface of the substrate 10 by a chemical or mechanical treatment, the two-layered film is cut such that a cross section extending from a surface of the two-layered film which faces the electroluminescence elements to a surface which is disposed at a side opposite to the surface which faces the electroluminescence elements is exposed, and the ratio of thickness between the first protective film 50a and the second protective film 50b along the cross section is confirmed by an optical microscope. Subsequently, a slice of the two-layered film having such a cross section is immersed in water at a temperature of 25 degree centigrade for 24 hours. Thereafter, the ratio of thickness between the first protective film 50a and the second protective film 50b along the cross section is confirmed again by the optical microscope. When the water absorption ratio of the second protective film 50b is larger than the water absorption ratio of the first protective film 50a, the increase of the weight and the volume of the second protective film 50b due to the immersion in water is larger than the increase of the weight and the volume of the first protective film 50a due to the immersion in water. Accordingly, the ratio (thickness of the second protective film 50b/thickness of the first protective film 50a) which is obtained by dividing the thickness of the second protective film 50b with the first protective film 50a assumes a larger value after immersing the two-layered film in water than before immersing the two-layered film in water.

In forming the first protective film 50a from the synthetic resin with chemical reaction curing in the same manner as the second protective film 50b, by setting a molecular weight of monomers or oligomers which constitute the resin material of the second protective film 50b smaller than a molecular weight of monomers or oligomers which constitute the resin material of the first protective film 50a, it is possible to form a larger number of spaces for capturing water molecules after curing them respectively in the second protective film 50b compared to the first protective film 50a. On the other hand, the number of functional groups contained in the synthetic resin film which constitutes the second protective film 50b may be set larger than the number of functional groups contained in the synthetic resin film which constitutes the first protective film 50a. In this case, portions which are relevant to the polymerization of monomers or oligomers are plugged with the functional groups.

By making the OLED display device of this embodiment satisfy the above-mentioned conditions, the OLED display device can further enhance the moisture-proof property.

To explain the protective film structure of this embodiment from a different viewpoint, it is preferable to set the elasticity modulus of the second protective film 50b larger than the elasticity modulus of the first protective film 50a (the elasticity modulus of the first protective film 50a<the elasticity modulus of the second protective film 50b). On the other hand, in this embodiment, the hardness of the second protective film 50b may be set larger than the hardness of the first protective film 50a (the hardness of the first protective film 50a<the hardness of the second protective film 50b). In forming the first protective film 50a and the second protective film 50b using the synthetic resin film with chemical reaction curing, it is possible to adjust the elastic modulus or the hardness of the first protective film 50a and the second protective film 50b to the above-mentioned ratios by changing the distribution of the molecular weight and the number of functional groups of the resin material which have been explained in conjunction with the water absorption ratio. Here, the elastic modulus and the hardness in this embodiment are defined as physical quantities which respectively exhibit small values with respect to the material having plasticity and respectively exhibit large values with respect to the material having resiliency. Accordingly, the relative evaluation of the elastic modulus and the hardness can be made using the above-mentioned durometer, for example.

By satisfying the above-mentioned conditions, in the OLED display device of this embodiment, it is possible to attenuate a stress from the outside and hence, it is possible to further increase the strength of the OLED display device.

Here, as a modification of the OLED display device of this embodiment, it may be possible to form a multi-layered protective film structure by sequentially laminating protective films of n layers from the first protective film to the n-th protective film (n being a natural number of 3 or more).

In this case, at least the n-th protective film (formed in a most spaced-apart manner from the electroluminescence element) among the above-mentioned protective films of n layers is formed of the above-mentioned synthetic resin film with chemical reaction curing.

Further, with respect to the multi-layered protective film, the first protective film covers the anodes 11, the OLED films 30 and the cathodes 15 as the protective film, and the protective films which are formed by being sequentially laminated to the first protective film are formed such that the first protective film is covered with the second protective film and the protective films are sequentially laminated until the n-th protective film, and the water absorption ratios of the above-mentioned respective protective films are gradually increased as the protective film is moved away from the electroluminescence element so as to satisfy a following formula (3).

the water absorption ratio of the first protective film<the water
absorption ratio of the second protective film< . . . <the water
absorption ratio of the n-th protective film (3)

Alternatively, the elastic modulus and the hardness of respective protective films are gradually increased as the protective film is moved away from the electroluminescence element so as to satisfy a following formula (4) or a following formula (5).

the elastic modulus of the first protective film<the elastic modulus
of the second protective film< . . . <the elastic modulus of the
n-th protective film (4)

the hardness of the first protective film<the hardness of the second
protective film< . . . <the hardness of the n-th
protective film (5)

[Embodiment 3]

Figure 7:
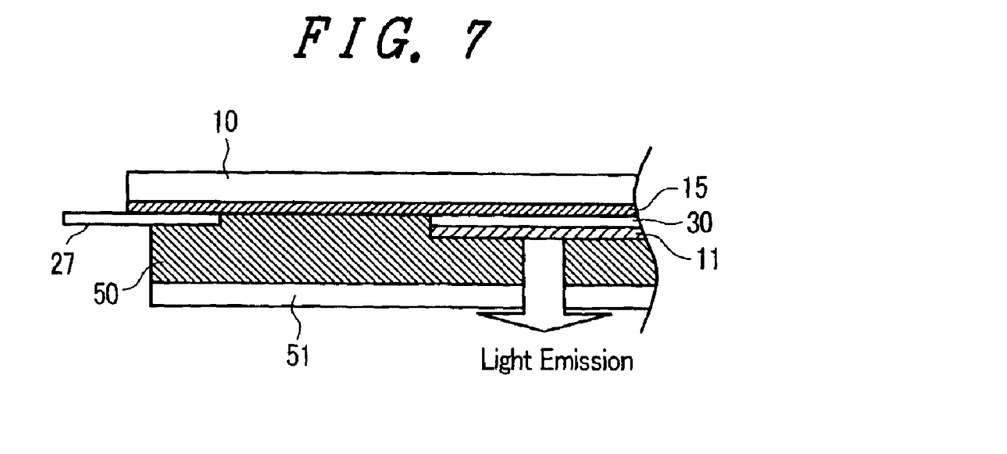
FIG. 7 is a cross-sectional view of an essential part showing the schematic constitution of an OLED display device according to an embodiment 3 of the present invention.

FIG. 7 is a cross-sectional view of an essential part showing the schematic constitution of the OLED display device of the embodiment 3 of the present invention.

The OLED display device of this embodiment differs from the OLED display device of the above-mentioned embodiment 1 with respect to following points.

(1) A point that light emitted from the light emitting layer 13 of the OLED film 30 is irradiated to the protective film 50 side as indicated by an arrow in FIG. 7.

(2) A point that a glass film (or a metal film) 51 is formed on the protective film 50.

Accordingly, in this embodiment, a transparent film is used as the protective film 50 and the cathodes 15 are formed at the substrate 10 side of the OLED films 30, and the anodes 11 are formed at the protective film 50 side of the OLED film 30. Here, it is preferable that the retardation (refractive index anisotropy) of the protective film 50 is set to a value equal to or less than 20 nm.

In this manner, according to this embodiment, the glass or metal film 51 is formed on the protective film 50 and hence, it is possible to further enhance the moisture-proof property and the strength against an external force.

Further, since the transparent protective film having the retardation (refractive index anisotropy) of not more than 20 nm is used as the protective film 50, it is possible to enhance the optical characteristics such as aberration. Accordingly, a phenomenon that lights which are irradiated from the neighboring pixels of the OLED display device interfere with each other can be eliminated so that a clear image can be displayed. On the other hand, since the retardation is defined as a product of the thickness d of the protective film 50 and the refractive index anisotropy Δn, when the thickness of the protective film 50 is set to a value substantially equal to the thickness of the substrate 10, the refractive index anisotropy Δn which the protective film 50 has to satisfy is extremely small. Accordingly, by applying the aliphatic resin compound or the alicyclic resin compound such as respective resin material of the above-mentioned epoxy resin series, urethane resin series, acrylic resin series, vinyl resin series and silicone resin series to the main surface of the substrate 10 and by curing the aliphatic resin compound or the alicyclic resin compound by a chemical reaction, the protective film 50 which exhibits the desired retardation can be formed.

[Embodiment 4]

Figure 8:
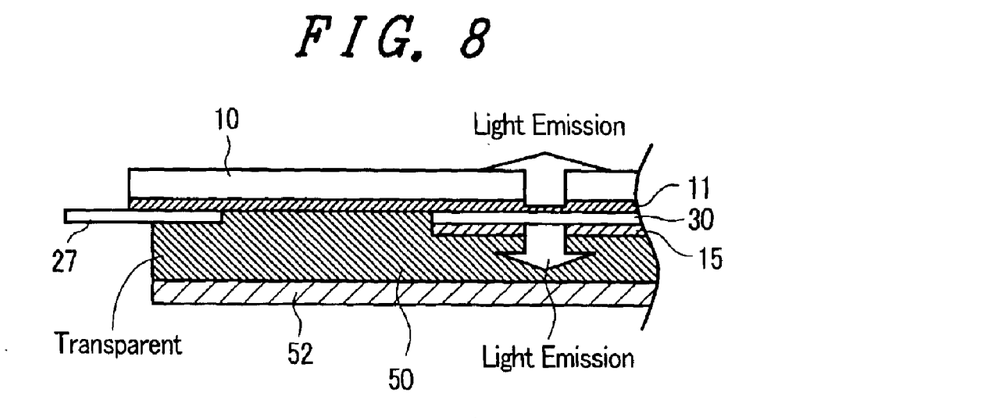
FIG. 8 is a cross-sectional view of an essential part showing the schematic constitution of an OLED display device according to an embodiment 4 of the present invention.

FIG. 8 is a cross-sectional view of an essential part showing the schematic constitution of the OLED display device according to the embodiment 4 of the present invention.

The OLED display device of this embodiment differs from the OLED display device of the above-mentioned embodiment 1 in a point that a photoelectric converting element (solar cell) 52 is formed on the protective film 50.

Accordingly, this embodiment also uses a transparent protective film as the protective film 50.

In general, in the OLED display device, light emitted from the light emitting layer 13 of the OLED film 30 is irradiated to both of the anode 11 side and the cathode 15 side.

Then, the light emitted to the cathode 15 side is reflected on metal films (for example, Al films) which constitute the cathodes 15 and is irradiated to the anode 11 side.

In this embodiment, the metal films which constitute the cathodes 11 are formed of thin films. Accordingly, the light which passes through the metal films which constitute the cathodes 11 are incident on the photoelectric converting element 52 so that the light is converted into electricity by the photoelectric converting element 52 and this electricity constitute a portion of the electric power supplied to the OLED display device.

The photoelectric converting element 52 is formed by sequentially laminating an amorphous transparent conductive film (indium-tin-oxide which is referred to as ITO, indium-zinc-oxide which is referred to as IZO), an n-type amorphous silicon film, a p-type amorphous silicon film, and an amorphous transparent conductive film to an outer surface (a lower surface in FIG. 8) of a region of the protective film 50 which faces at least the electroluminescence elements in an opposed manner, for example. Further, the photoelectric converting element 52 may be formed by adhering a silicon substrate having a main surface on which such pn junctions of the semiconductor layers are formed (solar cell) to the outer surface of the protective film 50.

Due to such a constitution, according to this embodiment, it is possible to reduce the power consumption.

Further, since the photoelectric converting element 52 is formed on the protective film 50, it is possible to further enhance the moisture-proof property.

Although the above-mentioned explanation is made in conjunction with the embodiments in which the present invention is applied to the single matrix type OLED display device, the present invention is not limited to the single matrix type OLED display device and it is needless to say that the present invention is applicable to the active matrix type OLED display device.

Although the present inventions which are made by the inventors have been explained specifically based on the above-mentioned embodiments, it is needless to say that the present inventions are not limited to the above-mentioned embodiments and various modifications can be made without departing from the spirit of the present inventions.

To recapitulate the advantageous effects brought about by the typical inventions among inventions disclosed by the present application, they are as follows.

(1) According to the OLED display device of the present invention which uses the electroluminescence elements, it is possible to reduce the thickness of the OLED display device compared to that of the conventional OLED display device.

(2) According to the OLED display device of the present invention which uses the electroluminescence elements, it is possible to reduce the weight of the OLED display device compared to that of the conventional OLED display device.

(3) According to the OLED display device of the present invention which uses the electroluminescence elements, it is possible to enhance the moisture-proof property compared to that of the conventional OLED display device.

(4) According to the OLED display device of the present invention which uses the electroluminescence elements, it is possible to reduce the manufacturing cost of the OLED display device compared to that of the conventional OLED display device.

What is claimed is:

1. A display device comprising:
a substrate;
electroluminescence elements which are mounted on the substrate; and
a protective film of n layers which is formed by sequentially laminating protective films of n layers ranging from the first protective film to the n-th protective film (n being a natural number of 3 or more) over the electroluminescence elements,
wherein at least the n-th protective film out of the protective films of n layers is formed of a synthetic resin film with chemical reaction curing, and
wherein hardness of the protective film of n layers which cover the electroluminescence element is gradually increased from the electroluminescence element side such that the hardness satisfies a following inequality:
the hardness of the first protective film<the hardness of the second protective film< . . . <the hardness of the n-th protective film.

2. A display device comprising:
a substrate;
electroluminescence elements which are mounted on the substrate; and
a protective film of n layers which is formed by sequentially laminating protective films of n layers ranging from the first protective film to the n-th protective film (n being a natural number of 3 or more) over the electroluminescence elements,
wherein at least the n-th protective film out of the protective films of n layers is formed of a synthetic resin film with chemical reaction curing, and
wherein elastic moduli of the protective films of n layers which cover the electroluminescence element gradually increase from the electroluminescence element side such that the elastic modulus satisfies a following inequality:
the elastic modulus of the first protective film<the elastic modulus of the second protective film< . . . <the elastic modulus of the n-th protective film.

3. A display device comprising:
a substrate;
electroluminescence elements which are mounted on the substrate; and
a protective film of n layers which is formed by sequentially laminating protective films of n layers ranging from the first protective film to the n-th protective film (n being a natural number of 3 or more) over the electroluminescence elements,
wherein at least the n-th protective film out of the protective films of n layers is formed of a synthetic resin film with chemical reaction curing, and
wherein water absorption ratios of the protective films of n layers which cover the electroluminescence element gradually increase from the electroluminescence element side such that the water absorption ratio satisfies a following inequality:
the water absorption ratio of the first protective film<the water absorption ratio of the second protective film< . . . <the water absorption ratio of the n-th protective film.

4. A display device according to claim 3, wherein the synthetic resin film with chemical reaction curing is a synthetic resin film of epoxy series, urethane series, acrylic series, vinyl series or silicone series.

5. A display device comprising:
a substrate;
electroluminescence elements which are mounted on the substrate;
a first protective film which covers the electroluminescence elements; and
a second protective film which covers the first protective film, wherein at least the second protective film out of the first protective film and the second protective film is formed of a synthetic resin film with chemical reaction curing, and wherein the elastic modulus of the second protective film is set larger than the elastic modulus of the first protective film.

6. A display device comprising:

a substrate;

electroluminescence elements which are mounted on the substrate;

a first protective film which covers the electroluminescence elements; and a second protective film which covers the first protective film, wherein at least the second protective film out of the first protective film and the second protective film is formed of a synthetic resin film with chemical reaction curing, and wherein the water absorption ratio of the second protective film is set larger than the water absorption ratio of the first protective film.

7. A display device according to claim 6, wherein the synthetic resin film with chemical reaction curing is a synthetic resin film of epoxy series, urethane series, acrylic series, vinyl series or silicone series.

8. A display device comprising:

a substrate;

electroluminescence elements which are mounted on the substrate; and a protective film which is formed to cover the electroluminescence elements; wherein the protective film is formed of a synthetic resin film with chemical reaction curing which exhibits a hardness of any value which falls in a range of 20 to 80 as the Shore hardness A.

9. A display device according to claim 8, wherein the synthetic resin film with chemical reaction curing is formed of at least one of epoxy series resin material, urethane series resin material, acrylic series resin material, vinyl series resin material and silicone series resin material.

10. A display device comprising:

a substrate;

electroluminescence elements which are mounted on the substrate; and a first protective film which is formed to cover the electroluminescence elements with resin material; and a second protective film which is formed to cover the first protective film with resin material; wherein the water absorption ratio of the second protective film is set larger than the water absorption ratio of the first protective film.

11. A display device comprising:

a substrate;

electroluminescence elements which are mounted on the substrate; and a first protective film which is formed to cover the electroluminescence elements with resin material; and a second protective film which is formed to cover the first protective film with resin material; wherein the elastic modulus of the second protective film is set larger than the elastic modulus of the first protective film.

* * * * *